(12) United States Patent
Yamauchi et al.

(10) Patent No.: US 6,731,558 B2
(45) Date of Patent: May 4, 2004

(54) SEMICONDUCTOR DEVICE

(75) Inventors: Tadaaki Yamauchi, Hyogo (JP); Takeo Okamoto, Hyogo (JP); Junko Matsumoto, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/211,377

(22) Filed: Aug. 5, 2002

(65) Prior Publication Data
US 2003/0081486 A1 May 1, 2003

(30) Foreign Application Priority Data
Oct. 29, 2001 (JP) ........................................ 2001-330753

(51) Int. Cl.$^7$ .............................. G11C 7/00; G11C 7/04
(52) U.S. Cl. ................... 365/222; 365/189.09; 365/211
(58) Field of Search ........................... 365/222, 189.09, 365/211; 327/512

(56) References Cited

U.S. PATENT DOCUMENTS

| | | | |
|---|---|---|---|
| 5,465,063 A | * | 11/1995 | Fukuda et al. .............. 327/512 |
| 5,495,452 A | * | 2/1996 | Cha .............................. 365/222 |
| 5,680,359 A | * | 10/1997 | Jeong ........................... 365/222 |
| 5,903,506 A | * | 5/1999 | Blodgett ....................... 365/222 |
| 5,943,280 A | * | 8/1999 | Tsukamoto et al. .......... 365/222 |
| 6,271,710 B1 | * | 8/2001 | Ooishi ........................... 327/512 |
| 6,556,496 B2 | * | 4/2003 | Benedix et al. .............. 365/222 |

FOREIGN PATENT DOCUMENTS

JP 7-122064 5/1995

* cited by examiner

Primary Examiner—Trong Phan
(74) Attorney, Agent, or Firm—McDermott, Will & Emery

(57) ABSTRACT

A bias voltage having a positive temperature dependency is supplied to a current source that determines the operating current of a refresh timer that issues a refresh request to allow the driving current of the current source to have a positive temperature characteristic. In this manner, the refresh cycle of the refresh timer shortens the issue intervals when the temperature rises, and lengthens the issue intervals of the refresh request when the temperature decreases. Thus, the consumed current for the refresh at room temperature is reduced. Consequently, the consumed current in a self-refresh mode under the room temperature condition can be reduced.

6 Claims, 6 Drawing Sheets

SEMICONDUCTOR DEVICE

BACKGROUND OF THE INVENTION

1. Field of the Invention

The present invention relates to a semiconductor memory device, and particularly to an arrangement of a self-refresh control circuit for internally and periodically rewriting and refreshing the stored data of a memory cell. More specifically, the present invention relates to an arrangement of refresh request generating circuitry for issuing a refresh request that provides a timing for performing the refresh in a self-refresh mode.

2. Description of the Background Art

FIG. 15 is a schematic diagram showing an arrangement of the main portion of a conventional semiconductor memory device. In FIG. 15, a semiconductor memory device includes a memory cell array 900 having a plurality of memory cells arranged in rows and columns, a row-related circuit 902 for selecting a row of memory cell array 900, when activated, according to a row address signal supplied, a column-related circuit 904 for selecting a column of memory cell array 900, when activated, according to a column address signal supplied, a command decoder 906 for decoding a command CMD externally supplied to generate an operating mode instruction signal instructing an operation mode designated by this command, a row-related control circuit 908 for activating row-related circuit 902 according to a row select instruction signal from command decoder 906, a refresh control circuit 910 rendered active in response to a self-refresh instruction from command decoder 906 for performing an operation necessary for the refresh, and a refresh timer 912 rendered active in response to a self-refresh mode instruction signal SELF from refresh control circuit 910 for issuing and supplying to refresh control circuit 910 a refresh request PHY in prescribed periods.

Command CMD normally designates an operating mode by a combination of the logic levels of prescribed external signals (control signals and specific address signal bits), for instance, at a rising edge of a clock signal. Command CMD may be supplied with a single signal, instead.

Refresh control circuit 910 starts refresh timer 912 when the self-refresh instruction signal is supplied from command decoder 900. Refresh timer 912 is started upon the activation of self-refresh mode instruction signal SELF and issues refresh request PHY in prescribed periods.

When refresh request PHY is issued, refresh control circuit 910 generates and supplies to row-related control circuit 908 a refresh activating signal RFACT. When refresh activating signal RFACT is activated, row-related control circuit 908 activates row-related circuit 902 to select a row of memory cell array 900. During the row selection of memory cell array 900 in the refresh mode, a refresh address from a refresh address counter, not shown, is utilized for the refresh row designation.

Row-related circuit 902 includes a circuit portion related to the row selection such as a row address decoder and a word line drive circuit, while column-related circuit 904 includes a circuit related to column selection such as a column decoder.

A memory cell arranged in memory cell array 900 is a DRAM cell (Dynamic Random Access Memory Cell) for storing information in a capacitor. Thus, in order to prevent the stored data of the memory cell from being dissipated due to a leakage current of the capacitor, the refresh operation is performed in prescribed periods according to refresh request PHY from refresh timer 912, to hold the stored data.

Normally, a ring oscillator is used in refresh timer 912. When activated, the ring oscillator is equivalently formed of an odd-number of stages of CMOS inverters. The operating speed of a CMOS inverter does not change so much within the operating temperature range. Therefore, by setting the refresh period according to the worst data holding time period of a memory cell, the stored data of the memory cell of memory cell array 900 can be held with certainty.

The CMOS inverter is formed by a P-channel MOS transistor and an N-channel MOS transistor, and the operating speed of the CMOS inverter may decrease a little due to the influence of hot carriers but would not change so much within the operating temperature range.

On the other hand, charges corresponding to the stored data are accumulated at a storage node of a capacitor in a memory cell. The storage node is coupled to an impurity region formed on a surface of a semiconductor substrate region. The impurity region is coupled to a source/drain region of an access transistor of the memory cell.

The impurity region of the storage node and the semiconductor substrate region are of different conductivity types so that a PN junction is formed between the both. When the leakage current of the PN junction becomes great, the charges accumulated in the storage node flow out and the stored data is lost. The leakage current of the PN junction has a positive temperature dependency and increases with the rise in the temperature. Since the leakage current has a temperature dependency, the data holding period of the memory cell also has a negative temperature dependency. Consequently, in order to ensure that the store data of the memory cell is held, there is a need to change the cycle of self-refresh according to the operating temperature. Thus, in the self-refresh mode, there is a need to shorten the refresh intervals as the operating temperature rises when performing the refresh operation.

In this case, in the case when the refresh cycle is set fixedly, according to the operating temperature, to the worst (shortest) refresh cycle corresponding to a high operating temperature, the refresh cycle would become unnecessarily short under a normal operating temperature region around a room temperature, and the current consumed in the self-refresh becomes great in amount. In particular, the self-refresh is performed in a standby state during which data is merely held, so that there arises a problem of increased standby current. Particularly, when the power supply is a battery as in the case of a portable equipment and the like, there is a need to reduce the consumed current in the self-refresh that is performed in a data hold mode such as a sleep mode, in order to lengthen the battery life.

In order to compensate for such temperature dependency of the refresh cycle, as shown in FIG. 16, a temperature sensor 925 may possibly be provided outside a semiconductor memory device 920, while internally disposing a temperature compensation circuit 930 for compensating for the cycle of refresh timer 912 according to a detected temperature of temperature sensor 925. Temperature sensor 925 is formed by a thermistor, for example, and according to the detected current or temperature of the thermistor, temperature compensation circuit 930 disposed within semiconductor memory device 920 controls the operating current of the ring oscillator forming refresh timer 912.

When such temperature sensor 925 is provided outside semiconductor memory device 920, however, temperature sensor 925 would be formed by a thermistor or a thermocouple, for instance, which occupies a large area, so that the area occupied by the entire system would increase.

In addition, in order to supply an output signal from temperature sensor 925 to temperature compensation circuit 930 provided inside semiconductor memory device 920, an extra pin terminal would be required for temperature compensation, which disadvantageously increases the assembling area of semiconductor memory device 920.

SUMMARY OF THE INVENTION

The object of the present invention is to provide a semiconductor memory device capable of performing temperature compensation of a self-refresh cycle with certainty and with small occupying area.

A semiconductor memory device according to the present invention includes a reference voltage generating circuit for generating a reference voltage having a temperature dependency, and a refresh request generating circuit having its operating speed defined by the reference voltage generated by the reference voltage generating circuit, for performing an oscillation operation and issuing a refresh request for requesting a refresh every prescribed number of times of oscillation when activated.

By generating a reference voltage having a temperature characteristic and changing the operating speed of the refresh request generating circuit according to the reference voltage, the operating speed of the refresh request generating circuit can be controlled according to the temperature. Particularly, by allowing the reference voltage to have a positive temperature characteristic, the operating current of the refresh request generating circuit can be increased with the rise in temperature. Consequently, the operating speed of the ring oscillator can be increased with the rise in temperature and the refresh request issue cycle can be shortened so as to compensate for the increase in the leakage current of the memory cell. In addition, in the operating temperature region around room temperature, the refresh cycle can be shortened and the current consumed by the refresh operation can be reduced so that the consumed current in standby can be reduced.

Moreover, simply, a reference voltage having the temperature dependency is generated internally so that there is no need to provide a temperature sensor and the like externally. Thus, the area occupied by the system can be reduced, and the increase in the number of pin terminals of the semiconductor memory device can be prevented so that the assembling area of the semiconductor memory device can be reduced.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
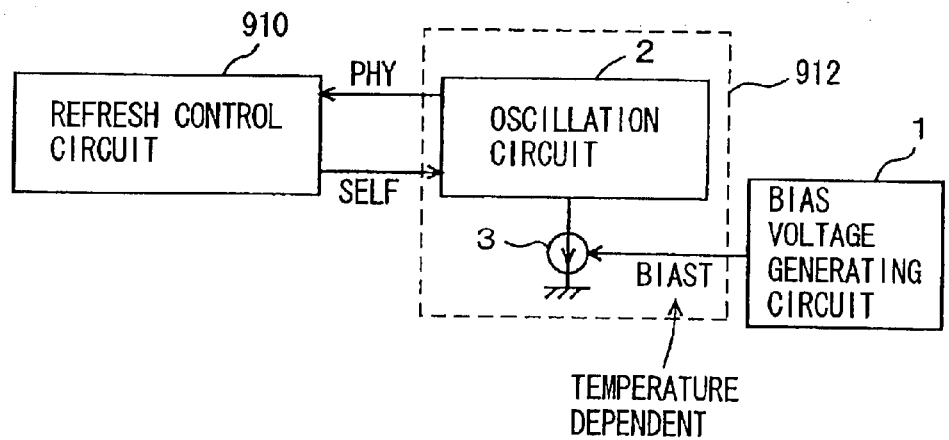
FIG. 1 is a schematic diagram of an arrangement of a refresh control portion according to a first embodiment of the present invention.

FIG. 1 is a schematic diagram showing an arrangement of a refresh control portion of a semiconductor memory device according to the first embodiment of the present invention. In FIG. 1, the refresh control portion includes a bias voltage generating circuit 1 for generating a bias voltage BIAST dependent on the temperature, a refresh timer 912 having its operating current defined according to bias voltage BIAST generated by bias voltage generating circuit 1 and performing an oscillation operation at a prescribed period for generating a refresh request PHY every prescribed number of times of oscillation when activated, and a refresh control circuit 910 for starting refresh timer 912 in a self-refresh mode.

Figure 2:
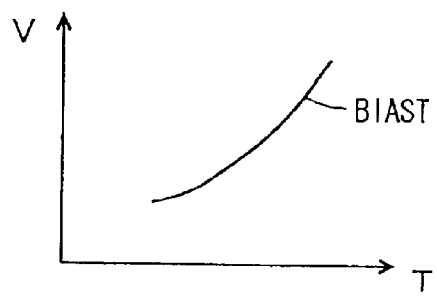
FIG. 2 is a diagram representing a temperature dependency of a bias voltage shown in FIG. 1.

Refresh timer 912 includes an oscillation circuit 2 rendered active during the activation of a self-refresh mode instruction signal SELF from refresh control circuit 910 for performing an oscillation operation at a prescribed period, and a current source 3 for determining the operating current of oscillation circuit 2 according to bias voltage BIAST from bias voltage generating circuit 1. Bias voltage BIAST generated by bias voltage generating circuit 1 has a positive temperature characteristic that its voltage level rises with the rise of temperature T, as shown in FIG. 2. Thus, as temperature T rises, bias voltage BIAST rises, and the driving current of current source 3 is also increased to increase the operating current of oscillation circuit 2. Oscillation circuit 2 is formed of a ring oscillator constructed by CMOS inverters, and the temperature dependency of its operating speed is sufficiently small in comparison with the temperature dependency of the leakage current of the PN junction. Thus, the oscillation period of oscillation circuit 2 becomes shorter according to the increase in the operating current, and the issue cycle of refresh request PHY becomes shorter.

In other words, upon the rise of temperature T, when the leakage current of the PN junction of a storage node of a memory cell increases, bias voltage BIAST is raised so as to shorten the oscillation period of oscillation circuit 2 for issuing refresh request PHY in short cycles or short intervals. Thus, even when the substrate leakage current of a memory cell increases with the rise in temperature T, the oscillation period of oscillation circuit 2 can be shortened so as to allow the refresh of the stored data of a memory cell with stability even when the leakage current increases.

Figure 3:
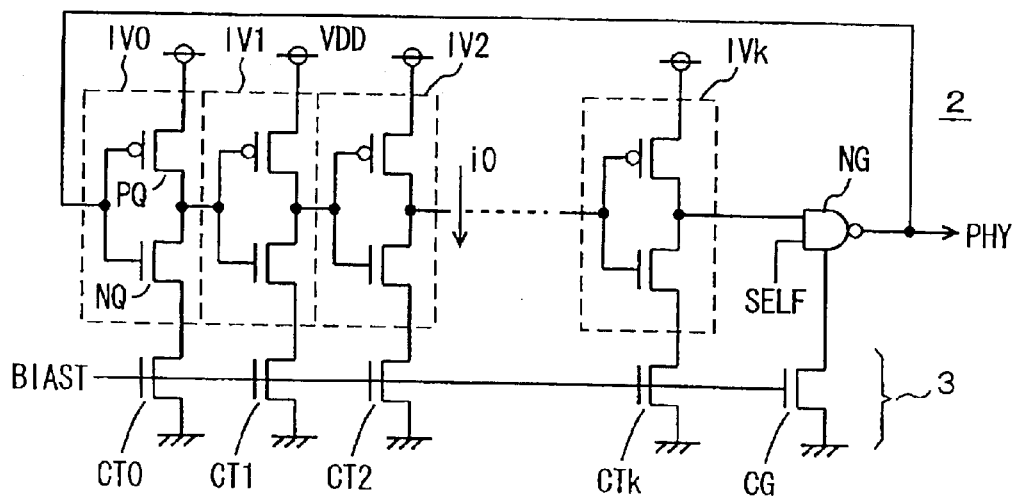
FIG. 3 is a diagram representing an arrangement of a refresh timer according to the first embodiment of the present invention.

FIG. 3 is a diagram representing an example of an arrangement of refresh timer 912 shown in FIG. 1. In FIG. 3, oscillation circuit 2 includes an even number of stages of cascaded inverters IV0 to IVk, and an NAND gate NG receiving an output signal from inverter IVk at the final stage and self-refresh mode instruction signal SELF. NAND gate NG issues refresh request PHY, and an output signal from NAND gate NG is fed back to inverter IV0 at the initial stage.

Inverters IV0 to IVk have the same circuit configuration, so that the reference characters are allotted only to the components of inverter IV0 in FIG. 3. Inverter IV0 includes a P-channel MOS transistor PQ and an N-channel MOS transistor NQ. Thus, oscillation circuit 2 is formed of a ring oscillator in which CMOS inverters are connected in a ring-like manner.

Current source 3 includes current source transistors CT0 to CTk connected between N-channel MOS transistors NQ of the respective inverters IV0 to IVk and ground nodes, and a current source transistor CG connected between a low level power supply node of NAND gate NG and a ground node. These current source transistors CT0 to CTk and CG are formed by N-channel MOS transistors that receive bias voltage BIAST at their respective gates.

When self-refresh mode instruction signal SELF is at the logic low or L level, refresh request PHY output from NAND gate NG is at the logic high or H level (by inverting refresh request PHY with an inverter of the next stage, a refresh request of a positive logic can be generated).

When self-refresh mode instruction signal SELF attains the H level, NAND gate NG operates as an inverter. Accordingly, in oscillation circuit 2, with inverters IV0 to IVk and NAND gate NG, the odd number of stages of inverters are connected in a ring-like manner to form a ring oscillator, and oscillation circuit 2 performs the oscillation operation. The oscillation period of oscillation circuit 2 is determined by the operating speed of inverters IV0 to IVk and NAND gate NG. This operating speed is determined by an operating current i0 that flows through each of inverters IV0 to IVk and NAND gate NG.

Operating current i0 is determined by the driving currents of current source transistors CT0 to CTk and CG. Therefore, when bias voltage BIAST rises, operating current i0 also rises, and the operating speed of inverters IV0 to IVk and NAND gate NG increases. Consequently, the oscillation period becomes short, and the issue period of refresh request PHY becomes short. In such a case, if the operating speed of inverters IV0 to IVk and NAND gate NG has a temperature dependency, the temperature dependency of the operating speed is compensated for by the amount of variation of operating current i0, and the temperature dependency of bias voltage BIAST is adjusted such that the increase in the leakage current of a memory cell is compensated for by the increase of the oscillation period with certainty.

Thus, even in the case where the leakage current of the memory cell is increased with the rise in temperature T, by speeding up the oscillation cycle of oscillation circuit 2 so as to shorten the issue cycle of refresh request PHY with the rise in the temperature, the loss of the stored data due to the increase in the leakage current of the memory cell can be prevented and the refresh of the stored data can be performed with certainty.

Moreover, in the operating temperature region around room temperature, the oscillation period of oscillation circuit 2 is longer than that in a high temperature region, and the issue cycle of refresh request PHY becomes long. Consequently, the number of times by which the refresh is performed can be reduced, and the current consumed while data is held can be reduced. In the low temperature region including a room temperature, the leakage current of a PN junction of a memory cell is reduced by its positive temperature dependency, so that the stored data of the memory cell can be refreshed with certainty even when the refresh interval is lengthened.

Figure 4:
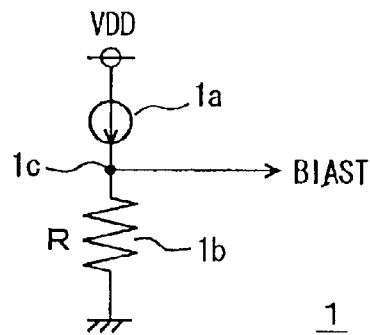
FIG. 4 is a diagram representing an example of an arrangement of a circuit for generating the bias voltage shown in FIG. 1.

FIG. 4 is a schematic diagram showing a construction of an example of the bias voltage generating circuit 1 shown in FIG. 1. In FIG. 4, bias voltage generating circuit 1 includes a constant current source 1a coupled to a power supply node for supplying a power supply voltage VDD and a resistance element 1b for converting the constant current from constant current source 1a into a voltage. Bias voltage BIAST is generated at a connecting node 1c of constant current source 1a and resistance element 1b. Resistance element 1b, for instance, is formed by a diffusion resistance or a well resistance that utilizes a well (substrate region) as a resistance, and a resistance value R has a large positive temperature characteristic.

A current i supplied by constant current source 1a is constant regardless of the temperature. This is achieved, for instance, by utilizing a constant current source having a temperature compensation function. Thus, when the temperature rises, resistance value R of resistance element 1b increases and bias voltage BIAST rises. Consequently, bias voltage BIAST having the positive temperature characteristic can be generated.

As described above, according to the first embodiment of the present invention, the operating current of an oscillation circuit that defines the refresh interval is controlled by a bias voltage having the positive temperature characteristic, so that the operating current can be increased with the rise in operating temperature. Thus, even when the leakage current of a memory cell increases with the rise in temperature, the stored data of the memory cell can be refreshed with accuracy. In addition, in a low temperature region such as room temperature, the issue cycle of refresh request PHY is shorter than that in the high temperature region. Thus, the refresh request issue cycle can be lengthened in a normal operating environment of the low temperature region such as room temperature, and the consumed current in the standby state in the low temperature region such as room temperature can be reduced.

Second Embodiment

Figure 5:
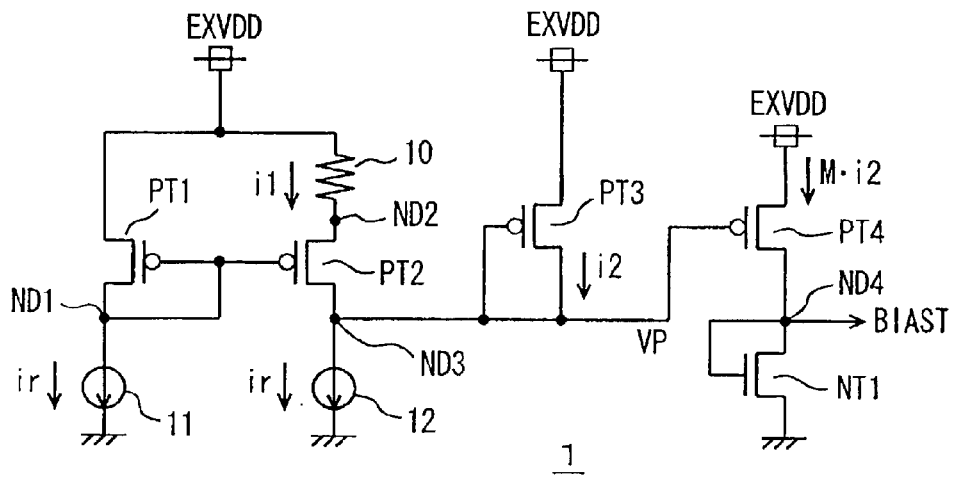
FIGS. 5 to 7 are diagrams respectively representing an arrangement of a bias voltage generating circuit according to the second, third, and fourth embodiments of the present invention.

FIG. 5 is a diagram representing an arrangement of a bias voltage generating circuit 1 according to the second embodiment of the present invention. In FIG. 5, bias voltage generating circuit 1 includes a P-channel MOS transistor PT1 connected between an external power supply node and an internal node ND1 and having a gate connected to internal node ND1, a resistance element 10 connected between the external power supply node and an internal node ND2, a P-channel MOS transistor PT2 connected between internal node ND2 and an internal node ND3 and having a gate connected to internal node ND1, a constant current source 11 coupled between internal node ND1 and a ground node, a constant current source 12 coupled between internal node ND3 and a ground node, a P-channel MOS transistor PT3 connected between an external power supply node and internal node ND3 and having a gate connected to internal node ND3, a P-channel MOS transistor PT4 connected between an external power supply node and an internal node ND4 and having a gate connected to internal node ND3, and an N-channel MOS transistor NT1 connected between internal node ND4 and a ground node and having a gate connected to internal node ND4. A bias voltage BIAST is generated at internal node ND4.

Resistance element 10 is formed by a diffusion resistance such as a P-well or N-well and the like, for instance, and its resistance value has a large positive temperature characteristic. Current sources 11 and 12 each generate constant current ir that does not depend on the temperature. MOS transistor PT3 has a gate and a drain interconnected, operates in a saturation region, and supplies a current i2 that corresponds to a difference between a voltage at internal node ND3 and an external power supply voltage EXVDD.

MOS transistor PT4 forms a current mirror circuit with MOS transistor PT4, and supplies a current according to the voltage level of internal node ND3 (a mirror current of the current that flows through transistor PT3).

MOS transistor NT1 has a gate and a drain interconnected, and its drain voltage is set by a current i2 supplied from MOS transistor PT4, and generates bias voltage BIAST. Now, an operation of bias voltage generating circuit 1 shown in FIG. 5 will be described.

The resistance value of resistance element 10 has a large positive temperature characteristic, and increases when the temperature rises. The gates of MOS transistors PT1 and PT2 are connected to internal node ND1, and MOS transistor PT1 supplies a constant current ir driven by constant current source 11.

When the resistance value of resistance element 10 increases, a current i1 that flows via resistance element 10 decreases, and accordingly, the current that flows via MOS transistor PT2 decreases, and the voltage level of node ND3 is lowered. When the voltage level of node ND3 is lowered, an absolute value of a gate-source voltage of MOS transistor PT3 becomes large, and a supply current i2 of MOS transistor PT3 increases. The voltage level of node ND3 is the voltage level at which current ir driven by constant current source 12 becomes equal to the sum of current i1 that flows via MOS transistor PT2 and current i2 that is supplied via MOS transistor PT3. In other words, the following condition is derived:

$ir = i1 + i2.$

Under this condition of equilibrium, since MOS transistor PT2 has a gate connected to node ND1 and has the same gate voltage as MOS transistor PT1 and the driving current of MOS transistor PT2 is smaller than that of MOS transistor PT1, a voltage VP of node ND3 decreases according to the decrease in the source voltage of MOS transistor PT2. When voltage VP of internal node ND3 decreases, a supply current M·i2 of MOS transistor PT4 increases and accordingly, the driving current of MOS transistor NT1 increases, and its drain voltage rises so that the voltage level of bias voltage BIAST from internal node ND4 rises.

On the other hand, when temperature T is lowered and the resistance value of resistance element 10 decreases, current i1 that flows via resistance element 10 increases. Constant current source 12 drives a constant current ir, and a driving current i2 of MOS transistor PT3 decreases, and accordingly, a driving current M·i2 of MOS transistor PT4 that forms a current mirror circuit with MOS transistor PT3 decreases. Particularly, when MOS transistors PT1 and PT2 operate in a weak inversion region, this current change becomes great.

Here, voltage level VP of internal node ND3 is a voltage level at which current ir driven by constant current source 12 becomes equal to the sum of currents i1 and i2 driven by MOS transistors PT2 and PT3. Consequently, when the resistance value of resistance element 10 decreases, voltage VP of internal node ND3 rises and the supplying current of MOS transistor PT4 decreases. Bias voltage BIAST from internal node ND4 decreases according to the decrease in supplying current M·i2 of MOS transistor PT4.

Therefore, as shown in FIG. 5, by connecting resistance element 10 having a resistance value with the positive temperature characteristic between MOS transistor PT2 which is a slave transistor of a current mirror stage and a power supply node as well as by additionally supplying a current corresponding to the voltage of the drain node of slave transistor PT2, voltage VP having a negative temperature characteristic can be formed, and accordingly, bias voltage BIAST having the positive temperature characteristic can be generated.

Resistance element 10 simply utilizes a well resistance or a diffusion resistance such as a P-well or an N-well, so that the resistance element having a large positive temperature characteristic can be implemented with small occupying area. The temperature characteristic of this resistance value is set to an appropriate value by adjusting the impurity concentration in a diffusion region forming the N-well or the P-well or the diffusion resistance.

In addition, MOS transistors PT1 and PT2 are disposed in proximity to one another, so that the temperature characteristics of the threshold voltages of these MOS transistors can be cancelled out, and the temperature characteristics of the channel resistances of these MOS transistors also can be cancelled out. Thus, the gate potential of MOS transistor PT2 is held at a constant voltage level at all times according to the voltage level of internal node ND1.

Moreover, the threshold voltage of the current/voltage converting N-channel MOS transistor NT1 also has a temperature dependency. N-channel MOS transistor NT1 forms a current mirror circuit with MOS transistors CT0 to CTk and CG of current source 3 shown in FIG. 3, and a current of the same magnitude would flow if these MOS transistors are identical in size (the ratio of channel width to channel length). In addition, the temperature dependency of the threshold value of MOS transistor NT1 is the same as the temperature dependency of the threshold voltages of these MOS transistors CT0 to CTk and CG. Consequently, even when the temperature dependency of the threshold voltage of MOS transistor NT1 is reflected on bias voltage BIAST, this temperature dependency is canceled out by the temperature dependency of the threshold voltages of MOS transistors CT0 to CTk and CG of current source 3. The driving current of current source 3 has a temperature dependency defined by the temperature dependency of the resistance value of resistance element 10. Thus, in order to determine the oscillation period of oscillation circuit 2 and its temperature dependency, the resistance value and the temperature dependency of resistance element 10 should be set respectively to the appropriate values while taking into consideration the positive temperature characteristic of resistance element 10. With this resistance element 10, the refresh cycle can be varied from a high temperature region of about 80° C. to a low temperature region of around room temperature by a factor of about three to four.

As described above, according to the second embodiment of the present invention, the bias voltage is generated by disposing a resistance element having a large positive temperature characteristic on the power supply node side of a slave transistor of a current mirror stage in the constant current generator. Thus, the bias voltage having a desired, large positive temperature characteristic can be generated with accuracy with a simple circuit arrangement.

Third Embodiment

Figure 6:
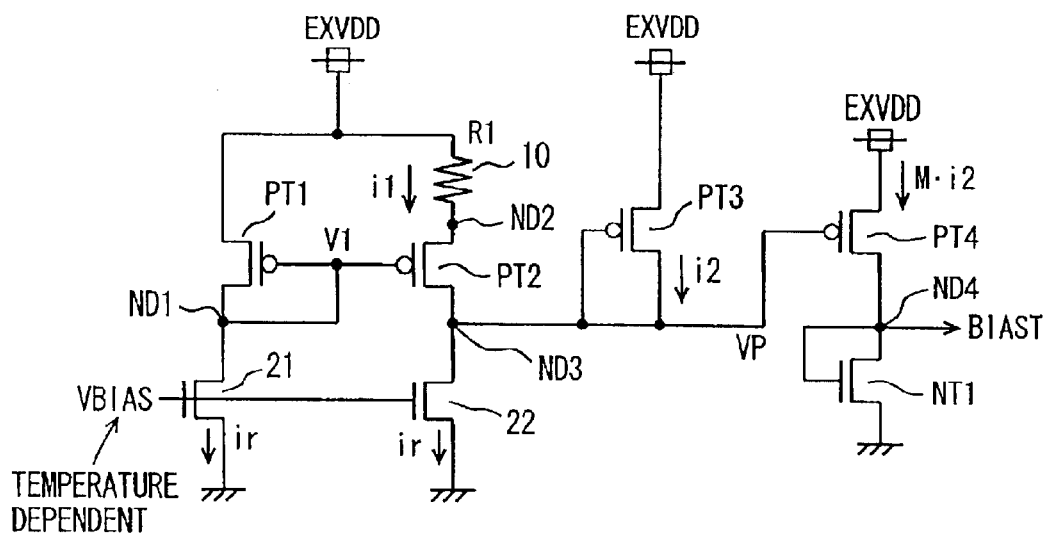

FIG. 6 is a diagram representing a construction of a bias voltage generating circuit 1 according to the third embodiment of the present invention. In bias voltage generating circuit 1 shown in FIG. 6, N-channel MOS transistors 21 and 22 that receive a bias voltage VBIAS at their respective gates are disposed in place of current sources 11 and 12. Bias voltage VBIAS has a positive temperature dependency. The arrangement in other portions of the bias voltage generating circuit shown in FIG. 6 is the same as the arrangement shown in FIG. 5 so that corresponding portions are denoted by the same reference characters, and the detailed description thereof will not be repeated.

MOS transistors 21 and 22 receive bias voltage VBIAS and operate as current sources. The voltage level of bias voltage VBIAS is low, and the currents driven by these MOS transistors 21 and 22 are sufficiently small. In this state, the gate-source voltage of MOS transistors PT1 and PT2 is close to the absolute value of the threshold voltage, and a weak inversion layer is formed in the channel region in MOS transistors PT1 and PT2. In such a state, if the voltage of node ND1 is V1, a current i1 that flows through MOS transistor PT2 is expressed by the following formula:

$$i1 \sim \exp(A(V1-i1 \cdot R1)),$$

where R1 indicates a resistance value of resistance element 10, and A is a prescribed coefficient. Current i1 decreases when resistance value R1 of resistance element 10 increases with the rise in temperature. In this case, a current i2 supplied by MOS transistor PT3 can be expressed by the following equation:

$$i2 = ir - i1.$$

Thus, current i2 increases, and a mirror current M·i2 that flows through MOS transistor PT4 that forms a current mirror circuit with MOS transistor PT3 increases.

Bias voltage VBIAS has the positive temperature characteristic so that current ir that flows via MOS transistor 22 also has the positive temperature characteristic. Thus, current ir increases with the rise in temperature so that current M·i2 that flows via MOS transistor PT4 further increases, and the positive temperature dependency of a bias voltage BIAST that defines the operating current of oscillation circuit 2 can be made even greater.

Here, in current source 3, current source transistors CT0 to CTk and CG shown in FIG. 3 and MOS transistor NT1 form a current mirror circuit, and a mirror current of current M·i2 that flows via MOS transistor NT1 flows through these current source transistors CT0 to CTk and CG.

Therefore, by providing the positive temperature dependency to the driving current of a current source transistor for the current mirror stage, the positive temperature dependency of the operating current of the oscillation circuit can be made even greater than that in the arrangement that utilizes bias voltage generating circuit 1 shown in FIG. 5.

For instance, the operating current can be varied between 80° C. and a room temperature by a factor of at least about three to four. Accordingly, the refresh interval at room temperature can be made at least about three to four times as long as that at a high temperature, so that the consumed current under the room temperature operating condition can be reduced.

As described above, according to the third embodiment of the present invention, a current driven by a current source of a circuit for generating a bias voltage has a positive temperature dependency so that the operating speed of an oscillation circuit is allowed to have a stronger positive temperature dependency. Thus, the refresh interval under the room temperature operating condition can be made longer, and the consumed current in a self-refresh mode under the room temperature condition can be reduced.

Fourth Embodiment

Figure 7:
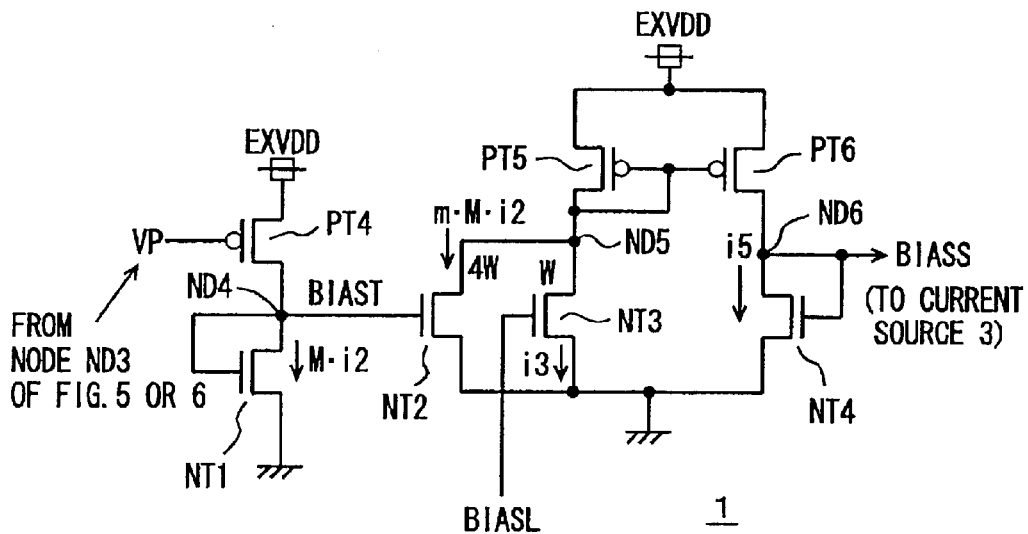

FIG. 7 is a diagram representing an arrangement of a bias voltage generating circuit 1 according to the fourth embodiment of the present invention. In bias voltage generating circuit 1 shown in FIG. 7, the following arrangement is additionally provided to the arrangement shown in FIG. 5 or FIG. 6. Specifically, bias voltage generating circuit 1 includes an N-channel MOS transistor NT2 coupled between a node ND5 and a ground node and receiving at a gate an output voltage BIAST of N-channel MOS transistor NT1 shown in FIG. 5 or in FIG. 6, an N-channel MOS transistor NT3 coupled between internal node ND5 and the ground node and receiving at a gate a bias voltage BIASL of a constant voltage level that is independent of the temperature, a P-channel MOS transistor PT5 connected between an output power supply node and node ND5 and having a gate coupled to node ND5, a P-channel MOS transistor PT6 connected between the external power supply node and a node ND6 and having a gate connected to node ND5, and an N-channel MOS transistor NT4 coupled between internal node ND6 and the ground node and having a gate connected to internal node ND6. A bias voltage BIASS to be supplied to a gate of each current source transistor of current source 3 shown in FIG. 3 is generated at node ND6.

The ratio of the channel width of MOS transistor NT2 to the channel width of MOS transistor NT3 is set, for instance, to the ratio of 4:1 (the channel length is the same). Accordingly, the current drivability of MOS transistor NT2 becomes greater than the current drivability of MOS transistor NT3. MOS transistor NT2 forms a current mirror circuit with MOS transistor NT1, and a mirror current m·M·i2 of a current M·i2 that flows through MOS transistor NT1, flows through MOS transistor NT2.

A current i3 corresponding to bias voltage BIASL flows through MOS transistor NT3. MOS transistors PT5 and PT6 form a current mirror circuit, and a mirror current that is the sum of a current m·M·i2 that flows via MOS transistor PT5 and current i3 that flows via MOS transistor NT3, flows via MOS transistor PT5. Consequently, even when bias voltage BIAST falls to a ground voltage level (about threshold voltage of MOS transistor NT1) and the current that flows via MOS transistor NT2 becomes substantially equal to 0, bias voltage BIASS would be generated according to driving current i3 of MOS transistor NT3.

Moreover, even in the case where the threshold voltages of an MOS transistor for generating bias voltage BIASL and of N-channel MOS transistor NT1 have a temperature dependency, such temperature dependency is canceled out by the temperature dependency of the threshold voltages of MOS transistors NT1 and NT3 shown in FIG. 7. In addition, the temperature dependency of the threshold voltage of MOS transistor NT4 that generates bias voltage BIASS is cancelled out by the temperature dependency of the threshold voltages of MOS transistors CT0 to CTk and CG of current source 3.

Figure 8:
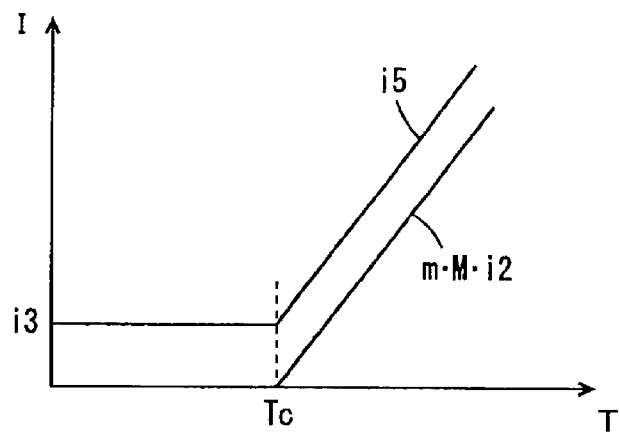
FIG. 8 is a diagram representing a temperature dependency of a bias voltage of the bias voltage generating circuit shown in FIG. 7.

Thus, as shown in FIG. 8, even in the case where a bias voltage BIAST generated by MOS transistor NT1 at a temperature Tc might attain a threshold voltage level of the MOS transistor and the current that flows in a current source might become 0, bias voltage BIASS can be generated from current i3 that flows via MOS transistor NT3, and a current i5 that flows via MOS transistor NT4 can be held at a constant current level determined by current i3. When MOS transistors PT5 and PT6 are identical in size and the mirror ratio is 1, in the region of temperature Tc and below, current i5 that flows via MOS transistors PT6 and NT4 becomes equal to current i3 that flows via MOS transistor NT3. Here, in FIG. 8, the vertical axis represents a current I, and the horizontal axis represents a temperature T. The temperature dependency of bias voltages BIASS and BIAST on the threshold voltage of an MOS transistor can be ignored for the operating current of the oscillation circuit for the following reason. In current source 3, the temperature dependencies of the bias voltages on the threshold voltages of the MOS transistors are all cancelled out as described above. As shown in FIG. 8, the current that flows via MOS transistor NT4, i.e., the operating current driven by current source 3 has the characteristic of being constant at temperature Tc and below and of increasing according to a resistance value of the resistance element at temperature Tc and above.

Consequently, even when a bias voltage VBIAS having a positive temperature characteristic from bias voltage generating circuit 1 falls to the threshold voltage level of MOS transistor NT1, the oscillation of the oscillation circuit can be ensured, and refresh request PHY can be issued in prescribed cycles.

In other words, even when bias voltage BIAST falls to a threshold voltage level or Vthn level at temperature Tc, the operating current of the oscillation circuit can be prevented from decreasing substantially to 0 to cause the oscillation cycle to approach infinity and the refresh interval to approach infinity. Thus, the refresh request can be issued in constant cycles with certainty so that the stored data of a memory cell can be reliably refreshed also in the low temperature region.

In the arrangement shown in FIG. 7, a constant current source for supplying a constant current that is independent of the temperature may be provided between an external power supply node and MOS transistors PT5 and PT6.

Figure 9:
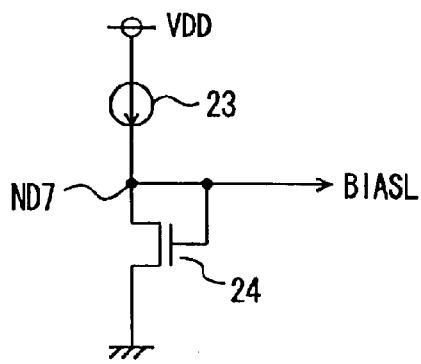
FIG. 9 is a diagram representing an example of an arrangement of a circuit for generating a bias voltage that is independent of the temperature shown in FIG. 7.

FIG. 9 is a diagram representing an example of an arrangement of a circuit for generating a bias voltage BIASL. In FIG. 9, the bias voltage generating circuit includes a constant current source 23 connected between a power supply node and a node ND7, and an N-channel MOS transistor 24 connected between node ND7 and a ground node and having a gate connected to node ND7. Bias voltage BIASL is generated at node ND7. Constant current source 23 supplies a constant current that is independent of the temperature. MOS transistor 24 generates bias voltage BIASL corresponding to the current supplied by constant current source 23. Even if the threshold voltage of MOS transistor 24 has a temperature dependency, as previously described, bias voltage BIASL is supplied to a gate of MOS transistor NT3 shown in FIG. 7, and the temperature dependencies of the threshold voltages of these MOS transistors 24 and NT3 cancel out one another, and a constant current i3 that is independent of the temperature and corresponds to the current supplied by constant current source 23, flows through MOS transistor NT3 shown in FIG. 7.

As a constant current source for supplying a constant current that is independent of the temperature, for instance, it may be suffice to eliminate resistance element 10 from the arrangement shown in FIG. 5 for using the circuit formed by MOS transistors PT1 and PT2 and current source 11, in which the current supplied by MOS transistor PT2 is supplied to MOS transistor 24 of FIG. 9 as an output constant current of the constant current source 23. By making the supplying current of constant current source 23 sufficiently small, the consumed current of the bias voltage generating circuit can be made sufficiently small.

As described above, according to the fourth embodiment of the present invention, a constant reference current (voltage) that is independent of the temperature is generated according to a constant bias voltage independent of the temperature and is supplied to a current source of an oscillator together with a reference current (voltage) having a temperature dependency. Thus, even when the temperature has decreased, the oscillation operation of the oscillation circuit can be prevented from being stopped, and the refresh of the stored data of a memory cell can be performed in prescribed cycles with certainty even during the operation in a low temperature region.

Fifth Embodiment

Figure 10:
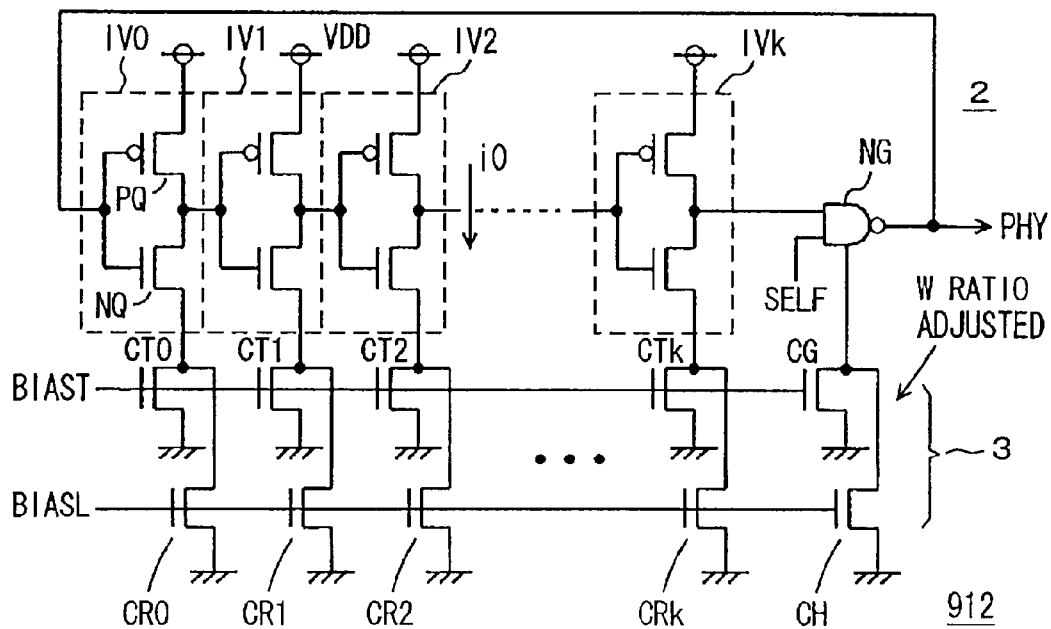
FIG. 10 is a diagram representing an arrangement of a refresh timer according to a fifth embodiment of the present invention.

FIG. 10 is a diagram representing an arrangement of a refresh timer according to the fifth embodiment of the present invention. In FIG. 10, current source transistors CR0 to CRk and CH are disposed in parallel to current source transistors CT0 to CTk and CG in addition to the arrangement of refresh timer 912 shown in FIG. 3, and the rate of W of each of transistors CT0–CTk, CG and respective transistors CR0–CRk and CH are adjusted. A bias voltage BIASL of a constant voltage level that is independent of the temperature is applied as a bias voltage to these constant current source transistors CR0 to CRk and CH. The arrangement in other portions of the refresh timer shown in FIG. 10 is the same as the arrangement of the refresh timer shown in FIG. 3 so that the same portions are denoted by the same reference characters, and the detailed description thereof will not be repeated.

In the arrangement of refresh timer 912 shown in FIG. 10, a bias voltage BIAST is supplied from the bias voltage generating circuit shown in FIG. 5. Thus, even in the case where the voltage level of bias voltage BIAST drops with the decrease in temperature, and current source transistors CT0 to CTk and CG enter the off state and the driving current becomes substantially equal to 0, the operating current defined by bias voltage BIASL is supplied to inverters IV0 to IVk and an NAND gate NG by constant current source transistors CR0 to CRk and CH, and the oscillation operation is performed at the operating speed corresponding to the operating current determined by bias voltage BIASL. Thus, the refresh can be performed in prescribed cycles even when the temperature decreases.

Modification

Figure 11:
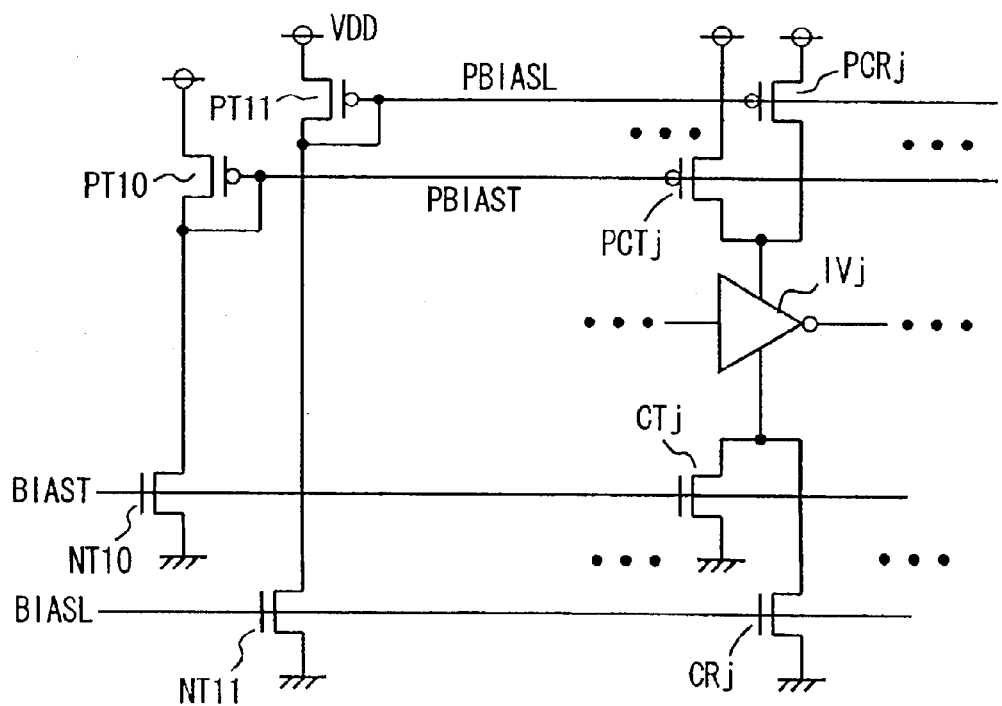
FIG. 11 is a diagram representing a modification of the refresh timer according to the fifth embodiment of the present invention.

FIG. 11 is a schematic diagram representing an arrangement of a refresh timer of a modification of the fifth embodiment of the present invention. In FIG. 11, one stage of inverter IVj that is included in an oscillation circuit 2 (ring oscillator) is representatively shown. In the arrangement of the refresh timer shown in FIG. 11, current source transistors PCTj and PCRj are provided on the high level power supply side of inverter IVj. In order to control the driving currents of these current source transistors PCTj and PCRj, there are provided an MOS transistor NT10 for receiving a bias voltage BIAST at a gate, a P-channel MOS transistor PT10 for supplying a current to MOS transistor NT10, an N-channel MOS transistor NT11 for receiving a bias voltage BIASL at a gate, and a P-channel MOS transistor PT11 for supplying a current to MOS transistor NT11 are provided. MOS transistors PT10 and PT11 each have a gate and a drain interconnected.

MOS transistor PT10 forms a current mirror circuit with current source transistor PCTj, while MOS transistor PT11 forms a current mirror circuit with current source transistor PCRj.

Currents of the same magnitude flow through MOS transistors NT10 and PT10, while currents of the same magnitude flow through MOS transistors NT11 and PT11. Consequently, a voltage PBIAST at a gate of MOS transistor PT10 has a negative temperature characteristic, and a voltage PBIASL at a gate of MOS transistor PT11 has a characteristic that is independent of the temperature. Thus, if MOS transistors NT10 and NT11 are equal in size and in current driving level to current source transistor CTj and constant current source transistor CRj, respectively, currents of the same magnitude as the currents that flow via current source transistor CTj and constant current source transistor CRj flow to MOS transistors PT10 and PT11, respectively.

If MOS transistor PT10 and current source transistor PCTj are identical in size (the ratio of channel width to channel length), and MOS transistor PT11 and constant current source transistor PCRj are identical in size, current source transistors PCTj and CTj supply operating currents of the same magnitude, and constant current source transistor PCRj drives the current of the same magnitude as that by constant current source transistor PCRj. Thus, a charging current and a discharging current of inverter IVj can be made the same magnitude. Consequently, the charging/discharging current of the inverter can be given a positive temperature characteristic, and the oscillation cycle can be given a positive temperature characteristic, and the rising and falling characteristics of the inverter of the ring oscillator can be made the same. As a result, the operating current of the inverter can be controlled according to the temperature with accuracy so as to provide the oscillation cycle with the positive temperature characteristic.

As described above, according to the fifth embodiment of the present invention, a constant operating current that is independent of the temperature is supplied as the operating current of an oscillation circuit of the refresh timer. Thus, the refresh can be performed in prescribed cycles in the same manner even when the temperature decreases, while the shortening of the refresh cycle can be ensured when the temperature rises.

Sixth Embodiment

Figure 12:
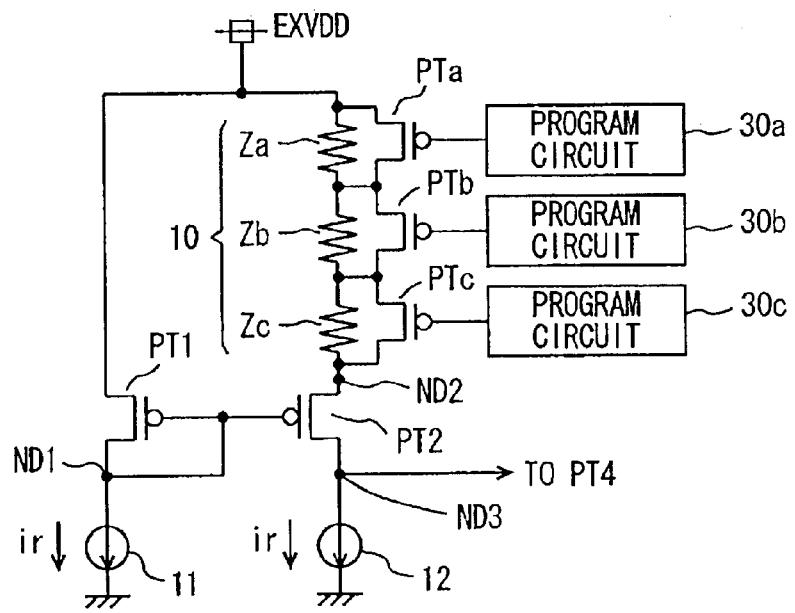
FIG. 12 is a diagram representing an arrangement of the main portion of a bias voltage generating circuit according to a sixth embodiment of the present invention.

FIG. 12 is a schematic diagram representing an arrangement of a bias voltage generating circuit 1 according to the sixth embodiment of the present invention. In FIG. 12, as a resistance element 10 having a positive temperature characteristic, a plurality of resistance elements Za, Zb, and Zc are connected in series between an external power supply node and a node ND2. In FIG. 12, three resistance elements Za to Zc connected in series are shown representatively as resistance element 10. The number of the resistance elements, however, is not limited to three, and may be determined appropriately according to the resistance values of resistance elements Za to Zc and the adjustment precision of the oscillation cycle.

P-channel MOS transistors PTa to PTc are provided in parallel to resistance elements Za to Zc, respectively. In order to set the on/off state of these MOS transistors PTa to PTc, program circuits 30a to 30c are disposed corresponding to the respective MOS transistors PTa to PTc.

When set to the on state, MOS transistors PTa to PTc cause the corresponding resistance elements Za to Zc to be shorted. Thus, when MOS transistors PTa to PTc are set to the on state, the resistance value of resistance element 10 becomes small. Therefore, even in the case where variation in the resistance value of resistance element 10 occurs due to the variation of a parameter in a manufacturing step, bias voltage BIAST of a desired voltage level can be generated by setting the on/off states of MOS transistors PTa to PTc by the corresponding program circuits 30a to 30c.

Moreover, in FIG. 12, MOS transistors PTa to PTc are disposed to the respective resistance elements Za to Zc. Instead, no programming MOS transistor PT may be provided to one resistance element to make use of this one resistance element as a basic resistance element for providing a basic resistance value as the basic resistance value of resistance element 10. In this arrangement, the P-channel MOS transistors for programming are disposed to the remaining resistance elements other than the one basic resistance element, to have their on/off state set by the corresponding program circuits.

Figure 13:
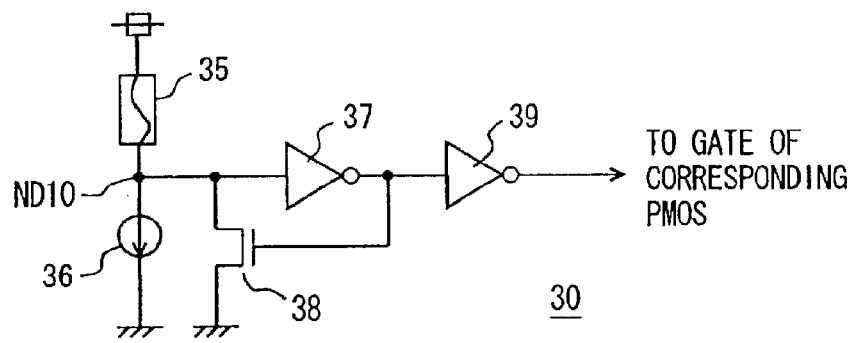
FIG. 13 is a diagram representing an example of an arrangement of a program circuit shown in FIG. 12.

FIG. 13 is a diagram representing an example of a construction of program circuits 30a to 30c shown in FIG. 12. Since these program circuits 30a to 30c have the identical construction, one program circuit 30 is generically shown in FIG. 13. In FIG. 13, program circuit 30 includes a fusible link element 35 connected between an external power supply node and an internal node ND10, a current source 36 connected between node ND10 and a ground node, an inverter 37 for inverting a signal at node ND10, an N-channel MOS transistor 36 rendered conductive when an output signal from inverter 37 is at the H level and driving node ND10 to a ground voltage level when rendered conductive, and an inverter 39 for inverting the output signal from inverter 37 and applying the inverted signal to a gate of a corresponding P-channel MOS transistor.

Current source 36 is formed by a resistance element of high resistance, for instance, and functions as a pull-down element for driving a very small current.

Link element 35 is a fuse element, for instance, and can be blown by an energy beam such as a laser beam. When link element 35 is blown, node ND10 is held at the ground voltage level by current source 36, and the output signal from inverter 37 attains the H level, so that MOS transistor 38 enters the on state. Consequently, node ND10 is held at the ground voltage level by inverter 37 and MOS transistor 38. Inverter 39 inverts the H level signal of inverter 37 to generate and apply an L level signal to a gate of a corresponding programming MOS transistor. Thus, when link element 35 is blown, a corresponding P-channel MOS transistor PTi (i=a–c) enters the on state, and accordingly, a corresponding resistance element Zi (i=a–c) is shorted.

On the other hand, when link element 35 is not blown, node ND10 is charged to the power supply voltage level by link element 35. The output signal from inverter 37 attains the L level, and MOS transistor 38 enters the off state. In this state, an output signal from inverter 39 attains the H level, and the corresponding P-channel MOS transistor PTi maintains the off state, and the corresponding resistance element Zi is used as a resistance component of resistance element 10.

Modification

Figure 14:
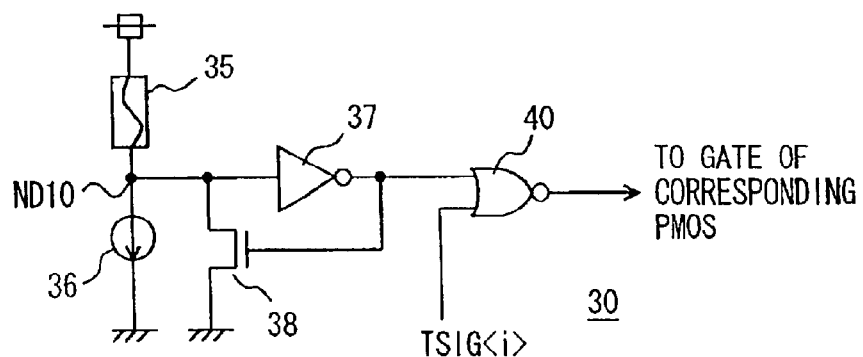
FIG. 14 is a diagram representing a modification of the program circuit shown in FIG. 12.
Figure 15:
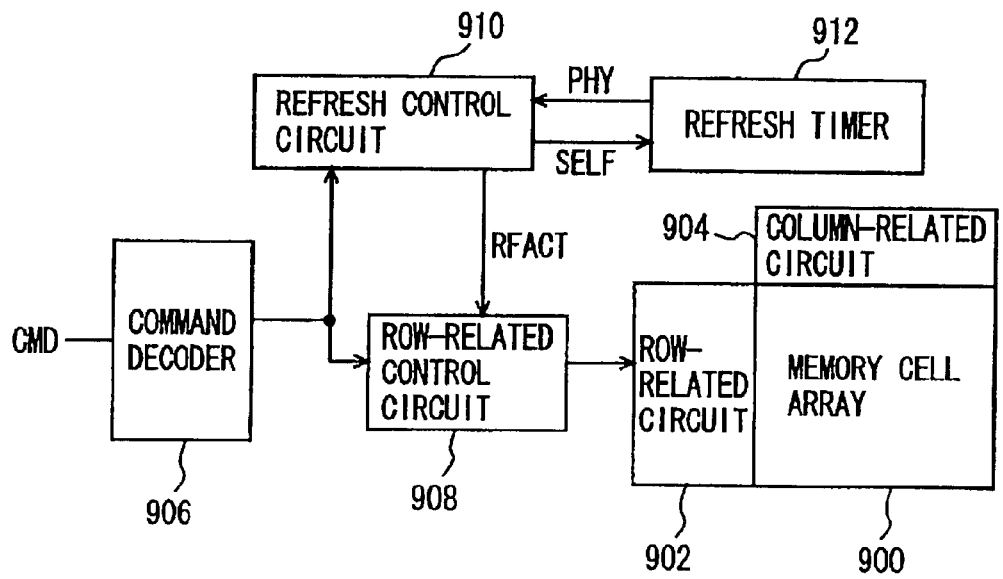
FIG. 15 is a schematic diagram of an arrangement of the main portion of a conventional semiconductor memory device.
Figure 16:
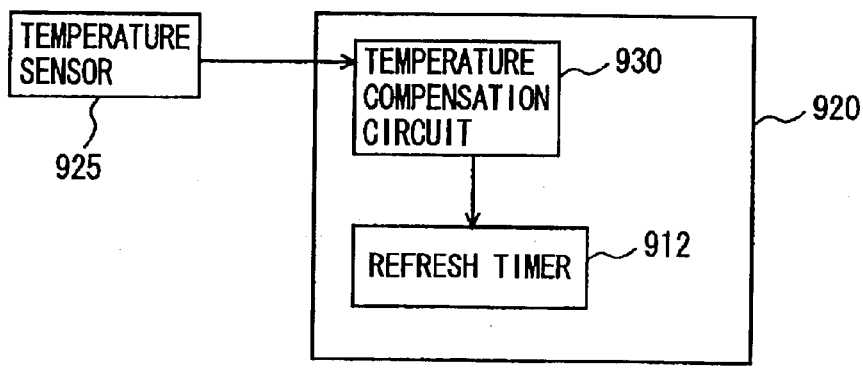
FIG. 16 is a diagram representing an example of a possible arrangement for temperature compensation of a refresh cycle.

FIG. 14 is a schematic diagram representing a construction of a modification of the program circuit shown in FIG. 12. In the construction of the program circuit 30 shown in FIG. 14, an NOR gate 40 receiving a test signal TSIG <i> and an output signal from inverter 37 is used in place of inverter 39 of program circuit 30 shown in FIG. 13. The arrangement in other portions of program circuit 30 shown in FIG. 14 is the same as the arrangement of the program circuit shown in FIG. 13 so that the corresponding portions are denoted by the same reference characters, and the detailed description thereof will not be repeated.

Test signal TSIG <i> is set selectively to the H level or the L level in a test mode. Test signal TSIG <i> is either supplied from a specific pad in the test mode or is set in a specific resister circuit to be generated in a test. If test signal TSIG <i> is at the H level, an output signal from NOR circuit 40 attains the L level, and the corresponding P-channel MOS transistor PTi enters the on state.

In the test mode, link element 35 is not blown yet, and the output signal from inverter 37 is at the L level. Consequently, if test signal TSIG <i> is set to the L level, the output signal from NOR gate 40 attains the H level, and the corresponding P-channel MOS transistor PTi maintains the off state.

Thus, in the test mode, resistance elements Za to Zc can be selectively short-circuited according to test signal TSIG <i> to derive the optimal bias voltage level.

Finally, in a laser blow step for the defective cell repair and the like of a semiconductor memory device, for instance, link element 35 is selectively blown according to the logic level of test signal TSIG <i>. After operating the refresh timer actually according to test signal TSIG <i>, fine adjustment can be made to the resistant value of resistance element 10 so as to achieve the optimal operating characteristic of the refresh timer.

With the arrangement of the program circuit shown in FIG. 13, the voltage level of bias voltage BIAST is measured and link element 35 is selectively blown based on the result of the measurement in the test mode.

As described above, according to the sixth embodiment of the present invention, a resistance value of a resistance element having a positive temperature characteristic that determines an operating current of an oscillation circuit can be trimmed. Thus, a refresh timer with a desired operating characteristic can be implemented with accuracy.

In addition, in the above-described example, the refresh timer issues a refresh request according to the oscillation cycle of the oscillation circuit. Instead, an oscillation signal of the oscillation circuit may be counted with a counter, and a refresh request may be issued every time the count of this counter reaches a prescribed value.

Moreover, the present invention is applicable to any semiconductor memory device with a self-refresh mode.

As described above, according to the present invention, the refresh cycle is internally changed according to the operating temperature. Thus, the stored data of a memory cell can be held with certainty and the consumed current for the refresh in the low temperature region covering a room temperature can be reduced without increase in system configuration and scale.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device requiring a refresh of storage data, comprising:
   reference voltage generating circuitry for generating a reference voltage having a temperature dependency; and
   refresh request generating circuitry having an operating speed determined by the reference voltage generated by said reference voltage generating circuitry, for performing an oscillation operation and issuing a refresh request for requesting said refresh every prescribed number of times of oscillation when activated, wherein said reference voltage generating circuitry includes
   first and second transistors forming a current mirror stage,
   a resistance element, having a resistance value having a positive temperature characteristic, interposed between the second transistor and a power supply node,
   first and second constant current sources coupled to said first and second transistors, respectively,
   a current supply element connected between a connecting node between said second transistor and the second constant source and said power supply node, and
   a current/voltage converting circuit, having a driving current determined according to a potential of said connecting node, for generating said reference voltage according to said driving current.

2. A semiconductor memory device requiring a refresh of storage data, comprising:
   reference voltage generating circuitry for generating a reference voltage having a temperature dependency; and
   refresh request generating circuitry having an operating speed determined by the reference voltage generated by said reference voltage generating circuitry, for performing an oscillation operation and issuing a refresh request for requesting said refresh every prescribed number of times of oscillation when activated, wherein said reference voltage generating circuitry includes
   first and second transistors forming a current mirror stage,
   a third transistor coupled between a referring node applying a referring potential of the first transistor and a ground, and receiving at a gate thereof a first bias voltage having a temperature dependency,
   a fourth transistor coupled between the referring node and the ground and receiving at a gate thereof a second bias voltage independent of a temperature, and
   a fifth transistor coupled between the second transistor and the ground and generating said reference voltage according to a driving current of said second transistor.

3. A semiconductor memory device requiring a refresh of storage data, comprising:
   reference voltage generating circuitry for generating a reference voltage having a temperature dependency; and
   refresh request generating circuitry having an operating speed determined by the reference voltage generated by said reference voltage generating circuitry, for performing an oscillation operation and issuing a refresh request for requesting said refresh every prescribed number of times of oscillation when activated, wherein said refresh request generating circuitry includes
   a first current source having a driving current determined by the reference voltage having the temperature dependency,
   a second current source having a driving current determined by a bias voltage independent of a temperature, and a ring oscillator comprised of a circuit stage having a first transistor having an operating current determined by the driving current of said first current source and a second transistor having an operating current determined by the driving current by said second current source, the first and second transistors arranged in parallel to each other, and when activated, said ring oscillator performs an oscillation operation and issuing said refresh request every prescribed number of times of oscillation.

4. The semiconductor memory device according to claim 1, wherein said resistance element is formed of a diffusion resistance.

5. The semiconductor memory device according to claim 1, wherein said current/voltage converting circuit generating said reference voltage as a first bias voltage having a temperature dependency, and said reference voltage generating circuitry further includes third and fourth transistors forming a current mirror stage, a fifth transistor coupled between a further referring node applying a further referring potential to the third transistor and a ground, and receiving at a gate thereof said first bias voltage, a sixth transistor coupled between the further referring node and the ground and receiving at a gate thereof a second bias voltage independent of a temperature, and a seventh transistor coupled between the fourth transistor and the ground and generating a final reference voltage applied to said refresh request generating circuitry according to a driving current of said fourth transistor.

6. The semiconductor memory device according to claim 1, wherein said refresh request generating circuitry includes a first current source having a driving current determined by the reference voltage having the temperature dependency, a second current source having a driving current determined by a bias voltage independent of a temperature, and a ring oscillator comprised of a circuit stage having a first transistor having an operating current determined by the driving current of said first current source and a second transistor having an operating current determined by the driving current by said second current source, the first and second transistors arranged in parallel to each other, and when activated, said ring oscillator performs an oscillation operation and issues said refresh request every prescribed number of times of oscillation.

* * * * *